(12) United States Patent
Wang et al.

(10) Patent No.: US 7,672,142 B2
(45) Date of Patent: Mar. 2, 2010

(54) GROUNDED FLEXIBLE CIRCUITS

(75) Inventors: Erik L. Wang, Redwood City, CA (US); Philip Michael Hobson, Menlo Park, CA (US); Kenneth A. Jenks, Cupertino, CA (US); Robert J. Hill, Salinas, CA (US); Robert W. Schlub, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 11/650,116

(22) Filed: Jan. 5, 2007

(65) Prior Publication Data

US 2008/0164055 A1 Jul. 10, 2008

(51) Int. Cl.
*H01R 12/16* (2006.01)

(52) U.S. Cl. .............. 361/789; 361/760; 361/792; 174/262

(58) Field of Classification Search ............... 361/789, 361/683, 685, 719, 760, 792, 828; 174/251, 174/262, 268; 29/846, 884; 324/754
See application file for complete search history.

(56) References Cited

U.S. PATENT DOCUMENTS

| | | | | |
|---|---|---|---|---|
| 2,099,896 | A | * | 11/1937 | Kinzel ................... 33/788 |
| 3,222,073 | A | * | 12/1965 | Degaetano ................ 369/63 |
| 3,453,377 | A | | 7/1969 | Gillespie |
| 4,433,223 | A | * | 2/1984 | Larson et al. ............. 200/512 |
| 4,620,165 | A | * | 10/1986 | Kinzler .................... 333/167 |
| 4,894,663 | A | | 1/1990 | Urbish et al. |
| 4,980,694 | A | | 12/1990 | Hines |
| 5,021,010 | A | | 6/1991 | Wright |
| 5,041,838 | A | | 8/1991 | Liimatainen et al. |
| 5,048,118 | A | | 9/1991 | Brooks et al. |
| 5,051,543 | A | | 9/1991 | McGuire |
| 5,061,827 | A | | 10/1991 | Grabbe |
| 5,295,214 | A | * | 3/1994 | Card et al. ................. 385/92 |
| 5,343,366 | A | * | 8/1994 | Cipolla et al. ............. 361/785 |
| 5,393,244 | A | | 2/1995 | Szegda |
| 5,424,547 | A | * | 6/1995 | Stark et al. ................ 250/372 |
| 5,489,500 | A | * | 2/1996 | Andrejack et al. .......... 430/313 |
| 5,509,827 | A | * | 4/1996 | Huppenthal et al. ......... 439/638 |
| 5,561,437 | A | | 10/1996 | Phillips et al. |
| 5,574,630 | A | * | 11/1996 | Kresge et al. .............. 361/792 |
| 5,604,831 | A | * | 2/1997 | Dittman et al. ............. 385/88 |
| 5,754,143 | A | | 5/1998 | Warnagiris et al. |
| 5,755,062 | A | * | 5/1998 | Slater ..................... 52/79.1 |
| 5,795,162 | A | * | 8/1998 | Lambert .................... 439/63 |

(Continued)

OTHER PUBLICATIONS

Hobsen et al. U.S. Appl. No. 60/883,587, filed Jan. 5, 2007.

(Continued)

*Primary Examiner*—Jinhee J Lee
*Assistant Examiner*—Xiaoliang Chen
(74) *Attorney, Agent, or Firm*—David C. Kellogg (57) ABSTRACT

Electronic devices may be provided with one or more electrical components that may be coupled to one or more circuit boards by flexible circuits that can have reduced ground lengths. Each flexible circuit can include at least one ground conductor that may run along its length and that may have at least one portion exposed for coupling to a grounding element that may also be coupled to a ground plane.

15 Claims, 5 Drawing Sheets

U.S. PATENT DOCUMENTS

| | | | |
|---|---|---|---|
| 5,798,984 A | 8/1998 | Koch | |
| 6,011,699 A | 1/2000 | Murray et al. | |
| 6,020,637 A * | 2/2000 | Karnezos | 257/738 |
| 6,025,760 A * | 2/2000 | Tang | 333/100 |
| 6,097,345 A | 8/2000 | Walton | |
| 6,172,874 B1 * | 1/2001 | Bartilson | 361/719 |
| 6,190,202 B1 | 2/2001 | Lai | |
| 6,281,451 B1 * | 8/2001 | Chan et al. | 174/262 |
| 6,337,662 B1 | 1/2002 | Cassel | |
| 6,396,692 B1 * | 5/2002 | Farshi et al. | 361/690 |
| 6,622,031 B1 | 9/2003 | McCleary et al. | |
| 6,624,503 B1 * | 9/2003 | Madsen et al. | 257/659 |
| 6,670,923 B1 | 12/2003 | Kadambi et al. | |
| 6,741,214 B1 | 5/2004 | Kadambi et al. | |
| 6,747,601 B2 | 6/2004 | Boyle | |
| 6,768,654 B2 * | 7/2004 | Arnold et al. | 361/818 |
| 6,809,265 B1 | 10/2004 | Gladd et al. | |
| 6,856,294 B2 | 2/2005 | Kadambi et al. | |
| 6,930,240 B1 * | 8/2005 | Giboney et al. | 174/393 |
| 6,968,508 B2 | 11/2005 | Lucaci et al. | |
| 6,980,154 B2 | 12/2005 | Vance et al. | |
| 7,013,558 B2 * | 3/2006 | Bachman | 29/832 |
| 7,027,838 B2 | 4/2006 | Zhou et al. | |
| 7,068,500 B1 | 6/2006 | Beinor et al. | 361/685 |
| 7,116,276 B2 | 10/2006 | Lee | |
| 7,119,747 B2 | 10/2006 | Lin et al. | |
| 7,153,161 B2 | 12/2006 | Huang et al. | |
| 7,187,556 B2 * | 3/2007 | Barr et al. | 361/760 |
| 7,291,038 B2 * | 11/2007 | Tadokoro | 439/493 |
| 7,295,083 B2 * | 11/2007 | Kimata et al. | 333/12 |
| 7,438,610 B2 | 10/2008 | Machado et al. | |
| 7,443,693 B2 * | 10/2008 | Arnold et al. | 361/800 |
| 2002/0050407 A1 * | 5/2002 | Sohn et al. | 174/262 |
| 2003/0063027 A1 * | 4/2003 | Allen, Jr. | 342/357.1 |
| 2003/0107518 A1 | 6/2003 | Li et al. | |
| 2004/0046579 A1 * | 3/2004 | Chraft et al. | 324/754 |
| 2004/0049914 A1 * | 3/2004 | Wang et al. | 29/884 |
| 2004/0053519 A1 * | 3/2004 | Li et al. | 439/63 |
| 2004/0057224 A1 * | 3/2004 | Kiko | 361/828 |
| 2004/0094328 A1 * | 5/2004 | Fjelstad et al. | 174/251 |
| 2004/0145521 A1 | 7/2004 | Hebron et al. | |
| 2004/0232447 A1 * | 11/2004 | Crane et al. | 257/202 |
| 2004/0234752 A1 * | 11/2004 | Arnold et al. | 428/336 |
| 2004/0246184 A1 * | 12/2004 | Demicco et al. | 343/702 |
| 2004/0247921 A1 * | 12/2004 | Dodsworth et al. | 428/544 |
| 2005/0062472 A1 * | 3/2005 | Bottomley | 324/317 |
| 2005/0090295 A1 * | 4/2005 | Ali et al. | 455/575.2 |
| 2005/0136703 A1 * | 6/2005 | Van Schuylenbergh et al. | 439/67 |
| 2005/0148330 A1 * | 7/2005 | Alberth et al. | 455/435.1 |
| 2005/0206468 A1 * | 9/2005 | Kimata et al. | 333/12 |
| 2005/0280485 A1 * | 12/2005 | Panetta et al. | 333/185 |
| 2006/0053436 A1 * | 3/2006 | Allwein et al. | 725/1 |
| 2006/0055606 A1 | 3/2006 | Boyle | |
| 2006/0160421 A1 * | 7/2006 | Dangler et al. | 439/607 |
| 2006/0240700 A1 * | 10/2006 | Tadokoro | 439/387 |
| 2006/0290364 A1 * | 12/2006 | DeLessert | 324/754 |
| 2007/0075717 A1 * | 4/2007 | Kinghorn et al. | 324/754 |
| 2007/0100666 A1 * | 5/2007 | Stivoric et al. | 705/3 |
| 2008/0007457 A1 * | 1/2008 | Copeland et al. | 343/700 MS |
| 2008/0074329 A1 | 3/2008 | Caballero et al. | |
| 2008/0166004 A1 | 7/2008 | Sanford et al. | |

OTHER PUBLICATIONS

Schlub et al. U.S. Appl. No. 11/650,071, filed Jan. 4, 2007.
Hobson et al. U.S. Appl. No. 11/968,331, filed Jan. 2, 2008.
Hobson et al. U.S. Appl. No. 11/821,329, filed Jun. 21, 2007.

* cited by examiner

GROUNDED FLEXIBLE CIRCUITS

BACKGROUND OF THE DISCLOSURE

The present invention can relate to apparatus and methods for coupling electrical components to a circuit board.

In some cases, an electronic device can include a housing with one or more electrical components and a circuit board. The circuit board can be used to mechanically support and electronically connect the one or more electrical components (e.g., input/output (I/O) components) to one another. Flexible circuits are typically used to couple electrical components to the circuit board.

Electrical components may be mechanically and electrically coupled to the circuit board by flexible circuits before or after the circuit board is disposed in the housing. Therefore, it is generally desirable to provide extra lengths of flexible circuit between each electrical component and the circuit board to facilitate easy insertion of the circuit board and electrical components into their appropriate locations with respect to the housing. Each electrical component and circuit board may be coupled to a respective end of a flexible circuit in such a way that they are grounded at those coupling points. However, a long ground length (i.e., the length between grounded points) of a signal path along a flexible circuit between an electrical component and the circuit board of an electronic device may provide a significant stretch of interconnect that floats, creates resonance, and is susceptible to electromagnetic and radio interference.

SUMMARY OF THE DISCLOSURE

Apparatus and methods for making connections between electrical components and circuit boards with reduced ground lengths are provided.

According to a particular embodiment of the present invention, an electronic device is provided that includes an electrical component, a circuit board, a flexible circuit coupled between the electrical component and the circuit board, and at least one grounding element coupled between the flexible circuit and a ground plane.

BRIEF DESCRIPTION OF THE DRAWINGS

The above and other features of the present invention, its nature and various advantages will become more apparent upon consideration of the following detailed description, taken in conjunction with the accompanying drawings, in which like reference characters refer to like parts throughout, and in which.

DETAILED DESCRIPTION OF THE DISCLOSURE

Apparatus and methods for making connections with reduced ground lengths in electronic devices are provided and described with reference to FIGS. 1-8.

Figure 1:
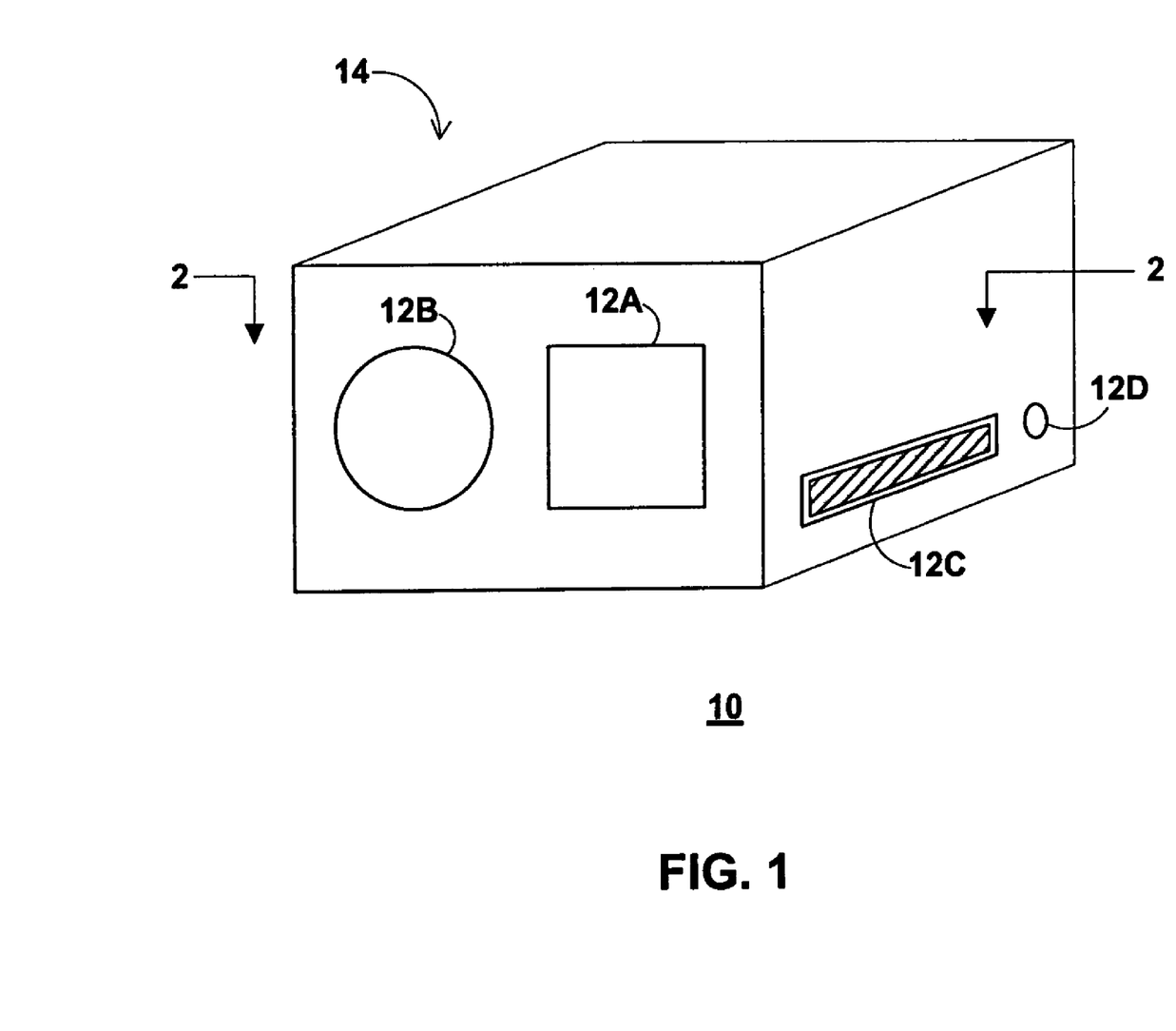
FIG. 1 is a perspective view of an exemplary electronic device in accordance with the principles of the present invention.
Figure 2:
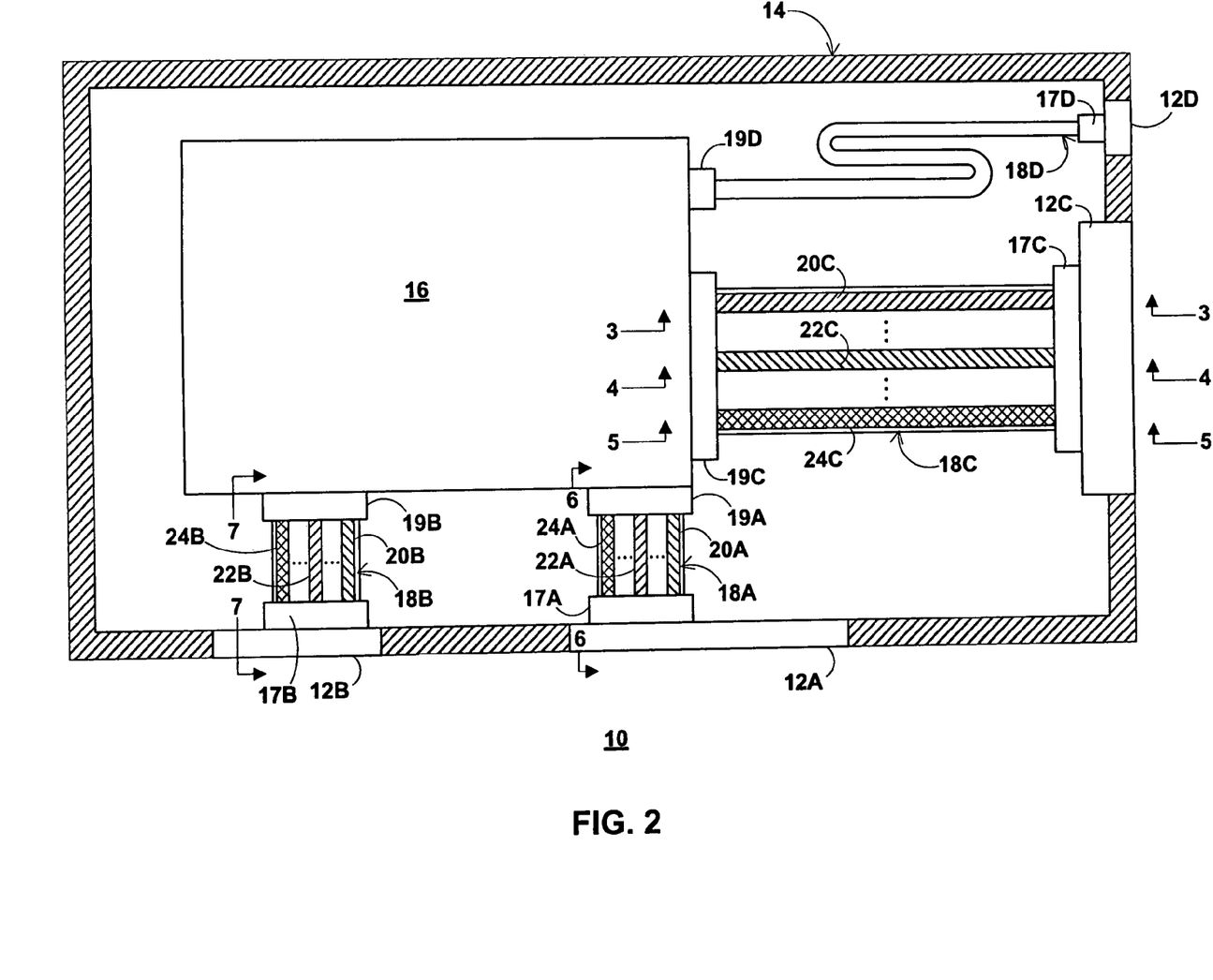
FIG. 2 is a horizontal cross-sectional view of the electronic device of FIG. 1, taken from line 2-2 of FIG. 1.

FIGS. 1 and 2 illustrate an exemplary electronic device that can incorporate the present invention. Electronic device 10 can be any electronic device that has at least one electrical component coupled to a circuit board, including portable, mobile, hand-held, or miniature consumer electronic devices. Illustrative electronic devices can include, but are not limited to, music players, video players, still image players, game players, other media players, music recorders, video recorders, cameras, other media recorders, radios, medical equipment, calculators, cellular phones, other wireless communication devices, personal digital assistants, remote controls, pagers, laptop computers, printers, or combinations thereof. Miniature electronic devices may have a form factor that is smaller than that of hand-held devices. Illustrative miniature electronic devices can include, but are not limited to, watches, rings, necklaces, belts, accessories for belts, headsets, accessories for shoes, virtual reality devices, other wearable electronics, accessories for sporting equipment, accessories for fitness equipment, key chains, or combinations thereof. Alternatively, electronic devices of the present invention may not be portable at all.

Electronic device 10 can have one or more electrical components, such as input/output (I/O) components 12A-12D, at least partially disposed within a housing 14. The I/O components can include any type of component that receives and/or transmits digital and/or analog data (e.g., audio data, video data, other types of data, or a combination thereof). For example, I/O component 12A may be a display that provides graphic images to a user, I/O component 12B may be a user input component that can permit a user to input data into the electronic device, I/O component 12C may be a multiple-pin connector that can permit electronic device 10 to interact with a computer, and I/O component 12D may be a media output connector that can output media data to an accessory. Accessories can include, but are not limited to, docks, printers, external storage devices, external displays, speakers, lanyards having headphones coupled thereto, and other audio and/or visual output devices.

In one embodiment, user I/O component 12B may be an antenna. In another embodiment, I/O component 12B may be a scroll wheel similar to that used by the iPod™ device sold by Apple Computer, Inc. of Cupertino, Calif., that may include one or more buttons for selecting software entries and a capacitive touchpad. In yet even other alternative embodiments, user I/O component 12B may include, for example, one or more buttons, a touchpad, a touch-screen display, electronics for accepting voice commands, infrared ports, or combinations thereof.

In one embodiment of the present invention, component 12C may be a multiple-pin connector having 30 pins that transmit data to and from the electronic device. Media output connector 12D can include, for example, an audio connector that transmits audio data to speakers or headphones. Alternatively, media output connector 12D can output, for example, video data, still image data, games data, or other media data known in the art or otherwise. Media output connector 12D also can output combinations of media data.

Housing 14 of electronic device 10 can be designed to protect the electrical components (e.g., I/O components 12A-12D) and at least one circuit board 16 coupled thereto. With further reference to FIG. 2, the signals of each I/O component 12A-12D may be coupled to circuit board 16, and the signals of circuit board 16 may be coupled to each I/O component 12A-12D, via a respective flexible circuit 18 (i.e., flexible circuits 18A-18D). Each of flexible circuits 18A-18D can include any flexible printed circuit (FPC), including one-sided, double-sided, multi-layer, dual access, rigid-flex FPCs, or combinations thereof. Circuit board 16 may be any type of circuit board, including, but not limited to, printed circuit boards (PCBs), logic boards, printed wiring boards, etched wiring boards, and other known boards, that may be used to mechanically support and electronically connect electrical components (e.g., I/O components 12A-12D via flexible circuits 18A-18D). Circuit board 16 may be constructed using one or more layers of a non-conductive substrate and signal conducting pathways. The signal conducting pathways can exist in one or more layers or in each layer of the non-conductive substrate. The signal conducting layers, sometimes referred to as traces, members, or leads, may be a metal conductive material (e.g., copper or gold) or an optical conductive material (e.g., fiber optics).

Electronic device 10 may include flexible circuit links at the coupling of each flexible circuit 18 with its respective electrical component 12 (e.g., component links 17A-17D) and at the coupling of each flexible circuit 18 with circuit board 16 (e.g., board links 19A-D). Component links 17 can couple the first ends of the conductive lines of each flexible circuit 18 to the signal receivers, transmitters, or transceivers of its respective electrical component (e.g., the pins of multiple-pin connector 12C), while board links 19 can couple the second ends of the conductive lines of each flexible circuit 18 to the signal-conducting pathways of its respective circuit board (e.g., circuit board 16). Each of links 17 and 19 may be provided by any technique, including, but not limited to, a through-hole construction, a surface-mount construction, a soldering construction, or any combination thereof. Each one of links 17 and 19 can also ground any ground signals of the circuit board 16 and/or electrical component 12 to be transmitted across the respective flexible circuit 18. Therefore, when electrical components 12 are physically and electrically coupled to board 16 via flexible circuits 18 and their respective links 17 and 19, board 16 may communicate with each of the electrical components 12 of device 10 concurrently in order for the device to function properly.

In addition to the signal path between each electrical component 12 and board 16 being grounded at each end of its respective flexible circuit 18 (e.g., at links 17 and 19), each signal path can be grounded at one or more points along the length of its flexible circuit 18 to reduce the ground length of that signal path. As shown in FIG. 2, a flexible circuit (e.g., flexible circuit 18C) can include at least one or more power conductors 20C, one or more signal conductors 22C, and one or more ground conductors 24C. Each of these conductors, sometimes referred to as traces, members, or leads, may be made of any suitable metal conductive material, including, but not limited to, copper, aluminum, steel, gold, or combinations thereof. Signal traces are usually narrower than power or ground traces because their current carrying requirements are usually much less.

Figure 3:
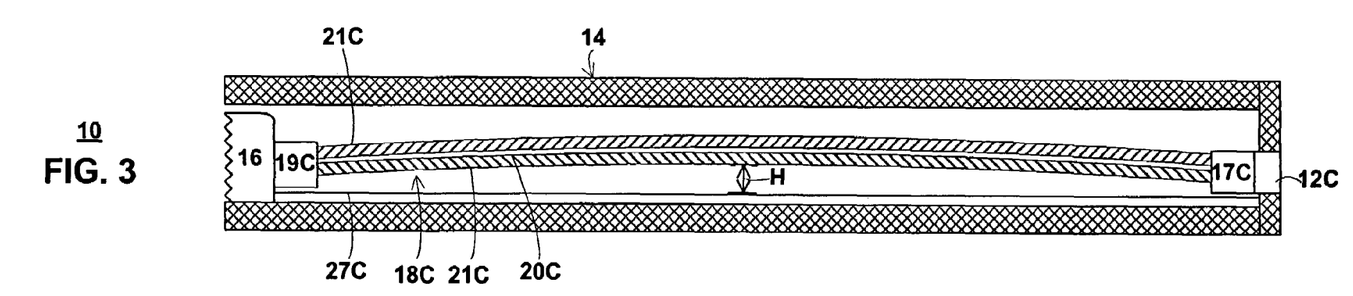
FIG. 3 is a horizontal cross-sectional view of a portion of the electronic device of FIGS. 1 and 2, taken from line 3-3 of FIG. 2.
Figure 4:
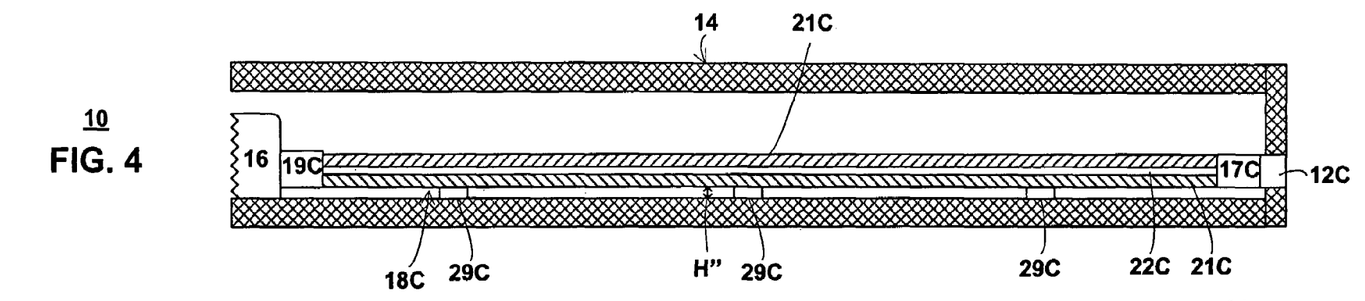
FIG. 4 is a horizontal cross-sectional view of a portion of the electronic device of FIGS. 1-3, taken from line 4-4 of FIG. 2.
Figure 5:
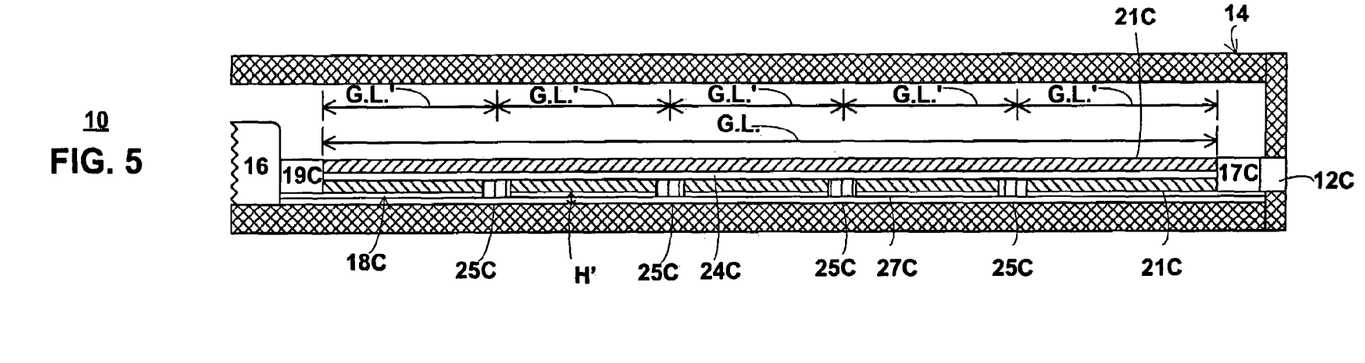
FIG. 5 is a horizontal cross-sectional view of a portion of the electronic device of FIGS. 1-4, taken from line 5-5 of FIG. 2.

Moreover, as shown in FIGS. 3-5, for example, each conductor in a flexible circuit can be provided with a protective covering to insulate, isolate, and/or environmentally seal the conductors and to protect the conductors from shorting. This protective covering for each conductor may be made of any suitable flexible polymer, including, but not limited to, silicone rubber, polyurethane, acrylic, epoxy, polymide film (e.g., Kapton®), PC/ABS polymer, or combinations thereof. The outer cover may be used to both protect the flexible circuit from wearing and shorting as well as to maintain the form of the flexible circuit for circuit consistency. Also, Mylar® sheets or shims, for example, may be used as an insulator between the flexible circuits and the outer cover, while Teflon® or any other suitable material, for example, may be used as an insulator. Solvay IXEF® or any other suitable material, for example, may be used as the material of an inner frame that may help properly space the traces and/or flexible circuits at optimum distances from one another for optimum circuit performance and to help isolate grounds.

For example, as shown in FIGS. 3-5, respectively, each one of power conductor 20C, signal conductor 22C, and ground conductor 24C of flexible circuit 18C may be insulated by a protective cover 21C along its length between board link 19C and component link 17C. As shown in FIG. 5, for example, the ground length of flexible circuit 18C containing ground conductor 24 between board link 19C and component link 17C (i.e., original ground length G.L.) may be reduced by removing one or more portions of protective cover 21C and coupling the one or more resultantly exposed portions of ground conductor 24C to a ground plane 27C with one or more grounding elements 25C.

Each one of grounding elements 25C may be provided by anyone of various technique, including, but not limited to, conductive adhesives (e.g., electrical tape), soldering, sponge gaskets, screw points, alligator clips, metal spring clips or fingers secured with metal screws or any other securable pressure/force device (e.g., rivets, nails, pins) or bonding agent or glue or laser welding or spot welding, crimp metal conductors that snap or solder into metal brackets that are laser welded to a main frame structure for ground, or any combination thereof. Furthermore, each grounding element 25C can extend to one or more ground planes 27C, each of which may be any electrically conductive surface that appears to most signals as an infinite ground potential, including, but not limited to, a specifically provided surface within the housing of the device (e.g., housing 14), or the housing itself, for example.

As shown in FIG. 5, four grounding elements 25C can be respectively coupled to four equally spaced exposed portions of ground conductor 24C and to ground plane 27C (e.g., a conductive layer of copper provided at least between housing 14 and the shown portion of flexible circuit 18C), thereby reducing the longest ground length along flexible circuit 18C between grounded links 17C and 19C to a reduced length of G.L.' (i.e., a ground length that is substantially one-fifth the length of original ground length G.L.). This reduction of the original ground length G.L. to that of five equally proportioned reduced ground lengths G.L.', by coupling a grounding element 25 between each of four exposed portions of ground conductor 24 and a ground plane 27, for example, can reduce the length of stretches of the signal path along flexible circuit 18C that float, create resonance, and are susceptible to electromagnetic and radio interferences. Therefore, this reduction of the original ground length G.L. may provide a more reliable and effective interconnect between an electrical component (e.g., component 12C) and a circuit board (e.g., board 16) on an electronic device 10.

Moreover, besides bolstering the performance of a flexible circuit, providing one or more grounding elements along the length of a ground conductor can reduce the space occupied by the flexible circuit within the housing of its electronic device. For example, as shown in FIG. 3, for example, flexible circuit 18C at power conductor 20C can extend to a height H above housing 14 (or, in this embodiment, above ground plane 27C) of device 10, because flexible circuit 18C may have an original length that can be greater than that between board link 19C and component link 17C when device 10 is assembled. This may be due to certain methods of assembling electronic devices that may require its flexible circuits to have some slack between its respective electronic component and circuit board, for example. However, as shown in FIG. 5, for example, the height at which flexible circuit 18C at ground conductor 24C may extend above housing 14 (or, in this embodiment, above ground plane 27C) of device 10 may be limited to a height H" that is significantly less than height H of FIG. 3, due to the one or more grounding elements 25C coupling ground conductor 24C to ground plane 27C. Therefore, in addition to reducing the ground length of a flexible circuit, coupling one or more grounding elements between exposed portions of a ground conductor and a ground plane can reduce the space consumed by and/or the warping of the flexible circuit.

The flexible circuit at conductors other than its one or more ground conductors may be coupled to portions of the housing along the length of the flexible circuit to similarly reduce the height to which that flexible circuit extends above the housing. For example, as shown in FIG. 4, the height at which flexible circuit 18C at signal conductor 22C may extend above housing 14 (or, in this embodiment, above ground plane 27C) of device 10 may be limited to a height H" that is significantly less than height H of FIG. 3, and can be equal to height H' of FIG. 5, due to the one or more coupling elements 29C coupling protective cover 21C about signal conductor 22C to ground plane 27C. By placing coupling elements 29C of a particular height with a particular spacing along the length of protective cover 21C about signal conductor 22C (as shown in FIG. 4) and along the length of protective cover 21C about power conductor 20C, the heights at which flexible circuit 18C at signal conductor 22C and power conductor 20C extend above housing 14 may be similar to that of circuit 18C at ground conductor 24C, thereby creating a relatively smooth profile for flexible circuit 18C at all its conductors.

Figure 6:
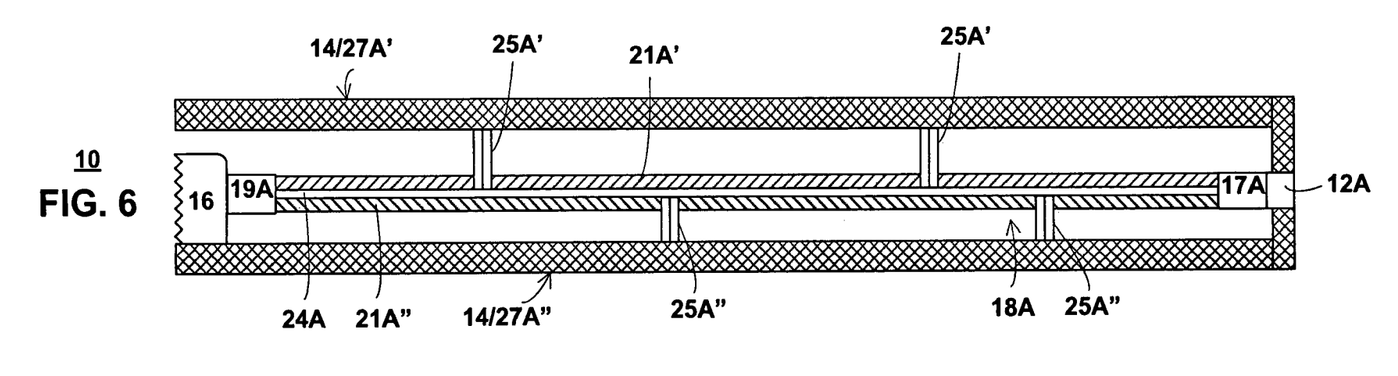
FIG. 6 is a horizontal cross-sectional view of a portion of the electronic device of FIGS. 1-5, taken from line 6-6 of FIG. 2.

Grounding elements may be coupled to various sides of a flexible circuit along its length and to various grounding planes, rather than coupling multiple grounding elements between the same ground plane and multiple exposed portions of a ground conductor along the same side thereof (see, e.g., FIG. 5). One or more grounding elements can be coupled between a first ground plane and exposed portions of a flexible circuit on a first one of its sides and one or more additional grounding elements may be coupled between a second ground plane and exposed portions of the flexible circuit on a second one of its sides. As shown in FIG. 6, for example, flexible circuit 18A may be provided with two grounding elements 25A' that can extend to first ground plane 27A' from portions of ground conductor 24A exposed by removing respective portions of upper protective covering 21A'. Furthermore, flexible circuit 18A may be provided with two grounding elements 25A" that can extend to second ground plane 27A" from portions of ground conductor 24A exposed by removing respective portions of lower protective covering 21A". First ground plane 27A' can be the portion of housing 14 above flexible circuit 18A, while second ground plane 27A" can be the portion of housing 14 below flexible circuit 18A.

Figure 7:
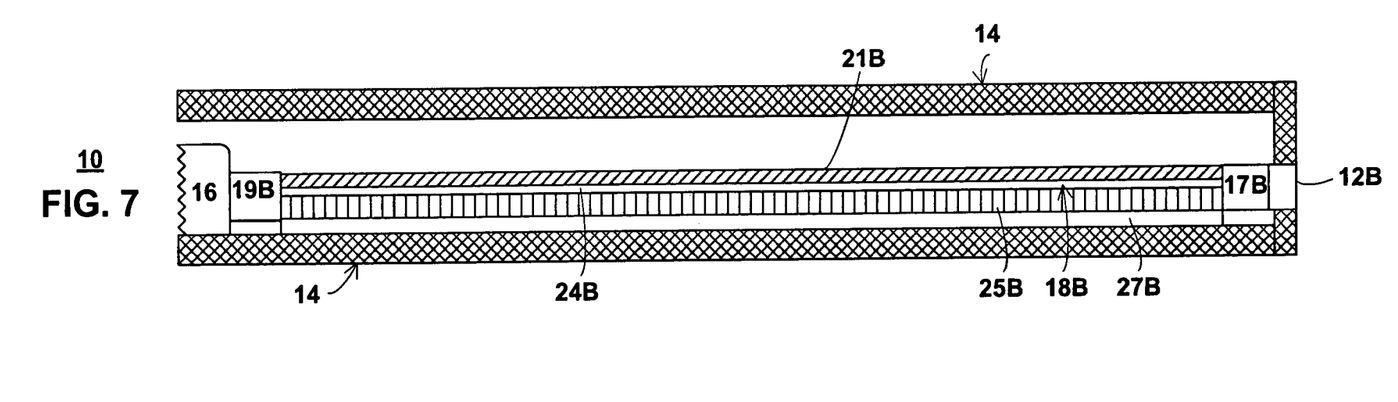
FIG. 7 is a horizontal cross-sectional view of a portion of the electronic device of FIGS. 1-6, taken from line 7-7 of FIG. 2.

Moreover, rather than coupling multiple grounding elements between ground planes and multiple exposed portions of a ground conductor (see, e.g., FIGS. 5 and 6), the entire length of a ground conductor of a flexible circuit can be exposed and coupled to a ground plane by a single grounding element. As shown in FIG. 7, flexible circuit 18B may be provided with only one grounding element 25B that can extend to a grounding plane 27B from the portion of ground conductor 24B exposed by removing the entire portion of protective covering 21B running along the bottom of the ground conductor. Ground plane 27B can be a conductive layer of metal provided exclusively between housing 14 and the exposed length of ground conductor 24B. Therefore, there may be no ground length between component link 17B and board link 19B of flexible circuit 18B.

Figure 8:
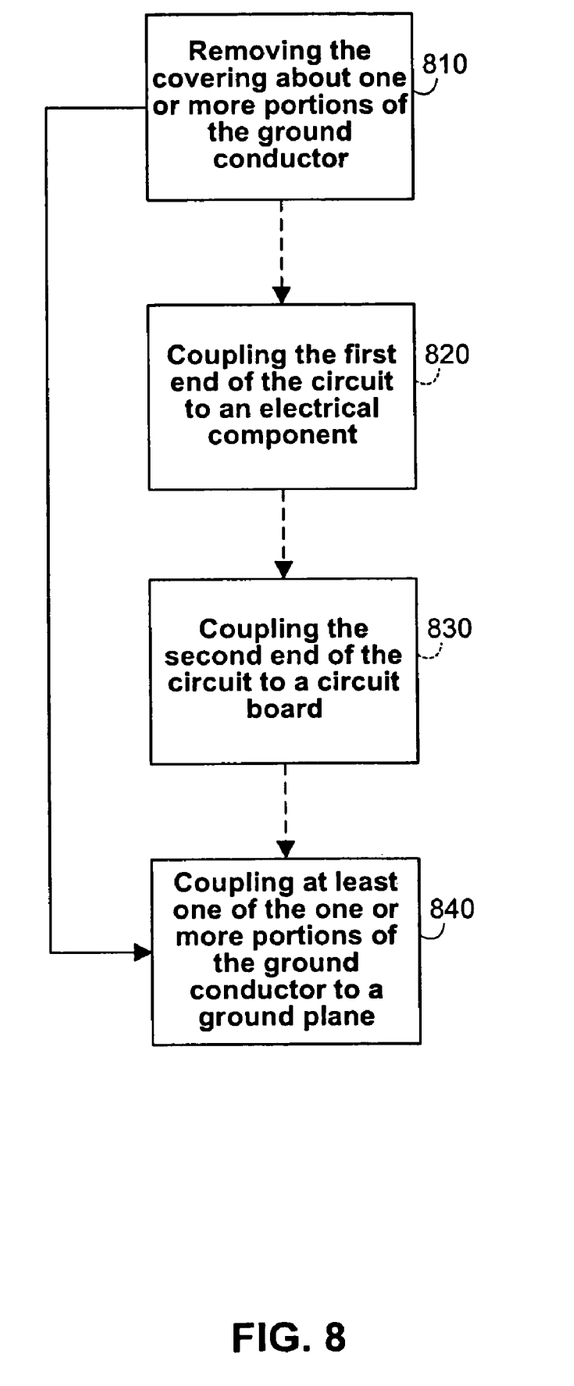
FIG. 8 is a flowchart of steps that may be taken for reducing the ground length of a circuit in accordance with the principles of the present invention.

FIG. 8 is an illustrative flowchart showing steps that may be taken for reducing the ground length of a circuit (e.g., circuits 18A-D of FIGS. 2-7) that may include a first end, a second end, and a signal path having a ground conductor (e.g., conductors 24A-C) that extends between the first end and the second end and that is surrounded by a covering (e.g., covering 21A-C). At step 810, one or more portions of the covering about one or more portions of the ground conductor between the first end and the second end may be removed. At optional step 820, the first end of the circuit may be coupled to an electrical component (e.g. components 12A-D). At optional step 830, the second end of the circuit may be coupled to a circuit board (e.g., board 16). At step 840, at least one of the one or more portions of the ground conductor, between the first end and the second end of the circuit where the covering has been removed, may be coupled to a ground plane by at least one grounding element (e.g., grounding elements 25A-C).

It is to be understood that the steps shown in FIG. 8 are merely illustrative and that the steps may be modified, additional steps may be added, and one or more of the steps may be omitted.

While there have been described electronic devices with electrical components coupled to circuit boards by flexible circuits having reduced ground lengths, it is to be understood that many changes may be made therein without departing from the spirit and scope of the present invention. It will also be understood that various directional and orientational terms such as "upper" and "lower," "length" and "height," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the present invention may be of any suitable three-dimensional shape, including, but not limited to, a sphere, cone, octahedron, or combination thereof, rather than a hexahedron, as illustrated by device 10 of FIGS. 1-8. Those skilled in the art will appreciate that the invention can be practiced by other than the described embodiments, which are presented for purposes of illustration rather than of limitation, and the invention is limited only by the claims which follow.

What is claimed is:

1. An electronic device, comprising:
   an electrical component;
   a circuit board;
   a flexible printed circuit coupled between the electrical component and the circuit board, wherein the flexible printed circuit has a first end coupled to the electrical component and a second end coupled to the circuit board; wherein the flexible printed circuit is formed from flexible polymer films, wherein the flexible printed circuit includes a ground conductor trace that has a length and includes a signal conductor trace, and wherein the ground conductor trace and the signal conductor trace are formed from metal traces surrounded by the flexible polymer films of the flexible printed circuit;

a conductive housing that encloses the electronic device and that forms a ground plane; and at least one grounding element electrically coupled between the ground conductor trace and the conductive housing, wherein the grounding element is electrically coupled to the ground conductor trace at least one point along the length of the ground conductor trace between the first and second ends of the flexible printed circuit and wherein the flexible polymer films have at least one hole through which the grounding element passes to electrically couple the ground conductor trace that is surrounded by the flexible polymer films to the conductive housing.

2. The electronic device of claim 1, wherein the grounding element is a conductive adhesive.

3. The electronic device of claim 1, wherein the grounding element is a solder.

4. The electronic device of claim 1, wherein the grounding element is a clip.

5. The electronic device of claim 1, wherein the grounding element is a weld.

6. The electronic device of claim 1, wherein the electrical component is an antenna.

7. The electronic device of claim 1, wherein the electronic device is a mobile telephone.

8. The electronic device of claim 1, wherein the electronic device is a remote control.

9. The electronic device defined in claim 1 wherein the at least one grounding element is electrically coupled to the ground conductor trace substantially along the entire length of the flexible printed circuit between the electrical component and the circuit board.

10. The electronic device defined in claim 1 further comprising a conductive metal layer between the conductive housing and the flexible printed circuit, wherein the grounding element is electrically coupled between the ground conductor trace and the conductive metal layer and wherein the conductive metal layer is electrically coupled to the conductive housing.

11. The electronic device defined in claim 1 further comprising a conductive metal layer of copper between the conductive housing and the flexible printed circuit, wherein the grounding element is electrically coupled between the ground conductor trace and the conductive metal layer of copper and wherein the conductive metal layer of copper is electrically coupled to the conductive housing.

12. The electronic device defined in claim 1 wherein the at least one grounding element is electrically coupled to the ground conductor trace along the entire length of the flexible printed circuit between the electrical component and the circuit board.

13. A flexible printed circuit in an electronic device having a conductive housing that encloses the electronic device, comprising:

a first end for coupling to an electrical component;
a second end for coupling to a circuit board;
at least one grounding element;
flexible polymer films extending between the first end and the second end;
a flexible circuit ground trace extending between the first end and the second end; and
a flexible circuit signal trace extending between the first end and the second end, wherein the flexible circuit ground trace and the flexible circuit signal trace are formed from metal traces surrounded by the flexible polymer films, wherein the flexible circuit ground trace is electrically coupled to the conductive housing through the grounding element at least one point along the flexible polymer films between the first end and the second end, and wherein the flexible polymer films have at least one hole through which the grounding element passes to electrically couple the flexible circuit ground trace that is surrounded by the flexible polymer films to the conductive housing.

14. The flexible circuit of claim 13, wherein the grounding element is a conductive adhesive.

15. The flexible circuit of claim 13, wherein the grounding element is a solder.

* * * * *